(12) United States Patent  (10) Patent No.: US 9,633,748 B2
Shibata  (45) Date of Patent: Apr. 25, 2017

(54) MULTI-CHANNEL TESTING

(71) Applicant: Micron Technology, Inc., Boise, ID (US)

(72) Inventor: Tomoyuki Shibata, Kokubunji (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/828,144

(22) Filed: Aug. 17, 2015

(65) Prior Publication Data

US 2017/0053711 A1    Feb. 23, 2017

(51) Int. Cl.

| | | |
|---|---|---|
| G11B 27/00 | (2006.01) | |
| G06F 11/00 | (2006.01) | |
| G11C 29/38 | (2006.01) | |
| G11C 29/36 | (2006.01) | |
| G11C 29/12 | (2006.01) | |

(52) U.S. Cl.
CPC ........ *G11C 29/38* (2013.01); *G11C 29/12015* (2013.01); *G11C 29/36* (2013.01)

(58) Field of Classification Search
CPC ..... G06F 13/28; G01C 29/38; G01C 29/1205; G01C 29/36; G01C 29/12015
USPC ............ 714/744, 798, 814, 811, 43, 42, 40; 710/107, 305, 308, 244, 240
See application file for complete search history.

(56) References Cited

U.S. PATENT DOCUMENTS

| | | | | |
|---|---|---|---|---|
| 7,831,755 B2* | 11/2010 | Yun | ...................... | G06F 13/385 710/301 |
| 2002/0161943 A1* | 10/2002 | Kim | ........................ | G06F 13/28 710/22 |
| 2010/0202229 A1* | 8/2010 | Osborne | .............. | G11C 7/1012 365/203 |

* cited by examiner

*Primary Examiner* — Christine Tu
(74) *Attorney, Agent, or Firm* — Schwegman Lundberg & Woessner, P.A.

(57) ABSTRACT

Apparatus and methods can include an interface chip that can include a test channel to couple to a memory tester, a memory channel controller to couple with a plurality of memory arrays via a plurality of memory channels, and a test circuit coupled between the test channel and the channel controller, the test circuit to provide first and second test clock information to the memory channel controller. In certain examples, the test circuit can operate to receive multiple commands and to propagate the multiple commands to groups of memory channels substantially simultaneously in order to test cross-channel interference using the multi-channel memory. Additional apparatus and methods are disclosed.

26 Claims, 6 Drawing Sheets

MULTI-CHANNEL TESTING

BACKGROUND

As memory devices of all types have evolved, continuous strides have been made in improving their performance in a variety of respects. For example, the storage capacity of memory devices has continued to increase at geometric proportions. This increased capacity, coupled with the geometrically higher operating speeds of electronic systems containing memory devices, has made high memory device bandwidth ever more critical useful. One application in which memory devices, such as dynamic random access memory ("DRAM") devices, require may benefit from a higher bandwidth is their use as system memory in computer systems. As the operating speed of processors has increased, processors are able to read and write data at correspondingly higher speeds. Yet conventional DRAM devices often sometimes do not have the bandwidth to read and write data at these higher speeds, thereby slowing the performance of conventional computer systems. This problem is exacerbated by the trend toward multi-core processors and multiple processor computer systems.

High Bandwidth Memory (HBM) systems represent another step in the evolution of memory devices that attempt to allow the use of a conventional DRAM device and yet achieve high-bandwidth memory access. In general, HBM systems access a stack of DRAM devices using multiple channels that can interface with respective DRAM locations independent of other channels. In some HBM systems, the independent operable channels can accommodate overlapping communications that can give rise to asynchronous noise between the channels that can negatively affects the operation of the HBM system. Present test apparatus and methods can identify certain constraints of an HBM system, such as damaged memory cells, but do not provide any guidance with respect to failures associated with identify channel interference issues.

DESCRIPTION OF THE EMBODIMENTS

In general, HBM systems can access a stack of DRAM devices using multiple channels that can interface with respective DRAM locations independent of other channels. In some HBM systems, the independent operable channels can give rise to asynchronous noise between the channels that can negatively affect the operation of the HBM system. Present test apparatus and methods can identify certain constraints of an HBM system, such as damaged memory cells, but do not provide any guidance with respect to failures associated with channel interference.

Figure 1:
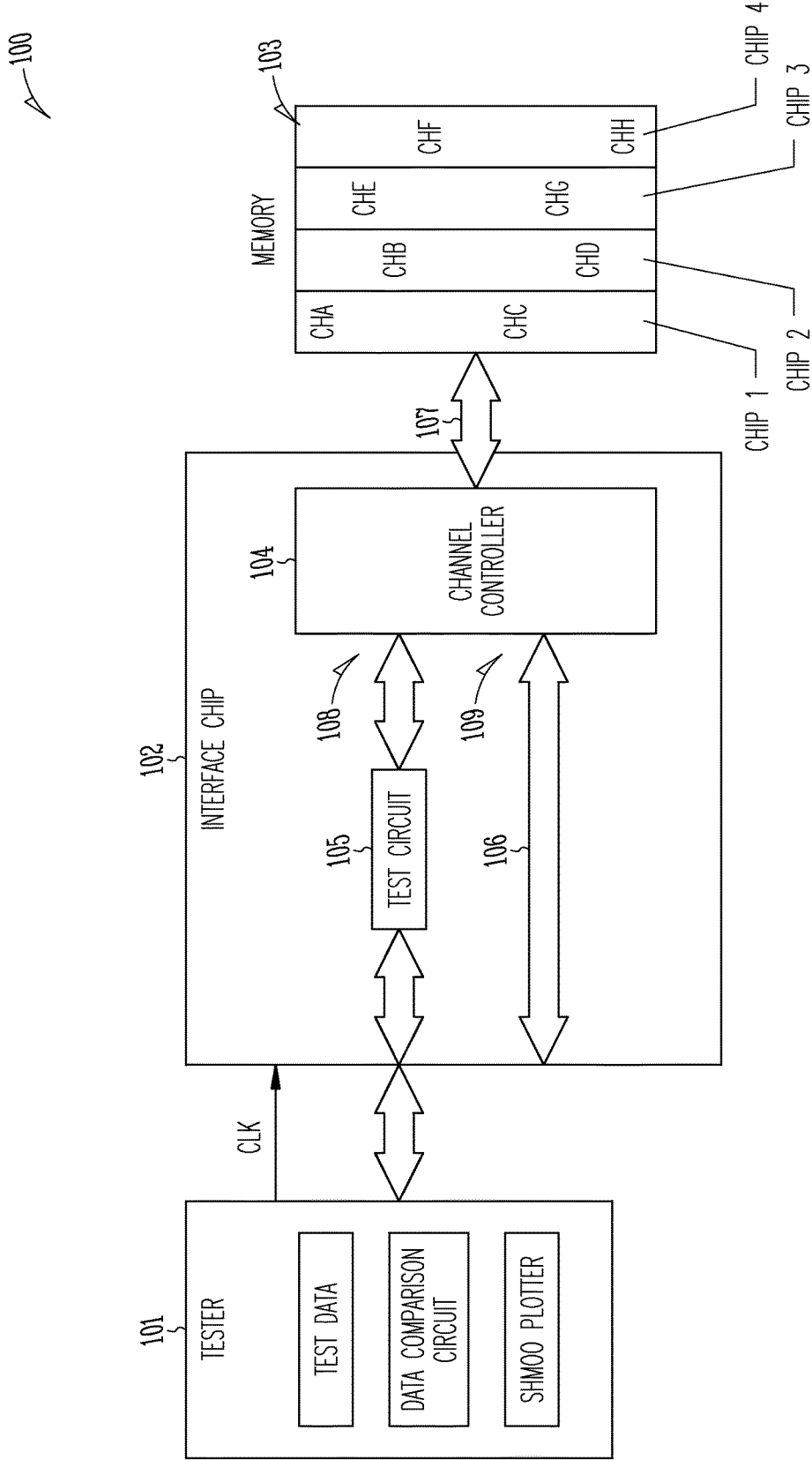
FIG. 1 illustrates an example HBM system coupled to a tester, according to various embodiments.

FIG. 1 illustrates an example HBM system 100 coupled to a tester 101 according to various embodiments. In certain examples, the HBM system 100 can include a memory interface chip 102 and a plurality of memory chips 103 or memory arrays such as a plurality of DRAM chips. In certain examples, the memory chips 103 can be stacked in one or more stacks. In certain examples, the one or more stacks of memory chips can be stacked with the memory interface chip 102. In some examples, the one or more stacks of memory chips can be stacked on a third chip and the memory interface chip 102 can be disposed on the third chip adjacent to the one or more stacks of memory chips.

In certain examples, the memory interface chip 102 can include a channel controller 104 or memory channel controller circuit, a test circuit 105 and a multi-channel bus 106. The channel controller 104 can be coupled to the test circuit 105 via a number of test terminals 108 and to the multi-channel bus 106 via a number of non-test terminals 109. In certain examples, the channel controller 104 can route memory commands and data to the memory chips 103 via a plurality of memory channels 107. In certain examples, the multi-channel bus 106 can provide the primary communication path way between a device processor and the memory locations of the HBM system 100. The multiple channels of the multi-channel bus 106 of the memory interface chip 102 can allow the limited bandwidth memory chips 103 to transfer and store memory at higher aggregate speeds than with a single channel bus. In certain examples, the test circuit 105 can receive instructions from the tester 101, can perform the test instruction in association with the channel controller 104 and the memory chips 103, and can pass test result information back to the tester 101 for issue identification and analysis. In some examples, the test circuit 105 can be coupled with the channel controller 104 and the tester 101 using a single channel.

In traditional HBM tests, a command is issued by the tester via the test circuit to one or more channels of the HBM system and the results are evaluated. Such tests can identify certain operational issues with the memory chips or the channel controller. The transmission of the test command or test information may be routed between the test circuit and the memory chips using a single clock or clock signal.

In some cases, HBM operation failures can be associated with asynchronous noise, such as asynchronous inter-channel noise resulting from the independently-controlled memory channels 107. Test apparatus and methods are described herein that allow the identification of certain channel timing or communication information that can give rise to excessive levels of asynchronous noise between channels. Once identified, the channel timing and communication information can be avoided to allow operation of the HBM under reduced noise conditions, to aggregately perform at or near design levels without corruption of memory information or operational interruption due to asynchronous noise between channels.

Referring again to FIG. 1, in certain examples, the multi-channel bus 106 can couple a device processor with the channel controller 104 to allow the device processor to have high bandwidth access to the memory chips 103. In certain examples, the test circuit 105 can relay test data to the memory chips 103 via the channel controller 104 and can execute test commands to evaluate operating conditions of the memory chips 103 as a whole, as well as, the operation of memory groups and individual memory cells. In certain examples, the test circuit 105 can generate test clock information to allow identification of conditions that result in memory function failure due to asynchronous noise such as inter-channel noise.

Unlike traditional HBM test circuits and sequences that do not exercise the full bandwidth of the HBM system 100, the example memory interface chip 102 of FIG. 1 can conduct tests using multiple clocks to simultaneously, but independently, communicate with the memory chips 103 over the multiple memory channels 107. In certain examples, a phase relationship of the clocks can be specifically set and swept during a test sequence to assist in identifying conditions where asynchronous, inter-channel noise interferes with operation of the HBM system 100.

In one example, the test circuit 105 can include selection circuitry (FIG. 2) that can route test commands and information generated at or received by the test circuit 105 via two circuit paths to two groups of one or more memory channels 107. In some examples, N memory channels exist, where N is a integer number greater than one, including a first group of memory channels from 1 up to N−1, and the second group of memory channels from 1 up to the number of remaining memory channels not included in the first group of memory channels.

A test can include at least partially simultaneously communicating test command information, such as test commands and test data, via both groups of memory channels where the propagation of test data via the first group of channels is regulated with first test clock information and the propagation of test data via the second group of memory channels is regulated with second test clock information. In certain examples, the selection circuitry can receive a selection command, for example from the test circuit 105, and can route the test commands and information to one of two groups of channels based on the selection command. It is understood that more sophisticated selection circuitry is possible such that more than two channel groups can be selected without departing from the scope of the present subject matter.

Upon execution of the test commands, actual data can be collected from the appropriate location, such as the memory if the test command was a write command, for example, and can be compared to the test data to evaluate whether inter-channel noise interfered with either command operation. In certain examples, a phase of one of the test clocks can be swept over the cycle of the other test clock to evaluate the susceptibility of one or more channels to timing of the at least partially simultaneous test command information.

In certain examples, the memory interface chip 102 can include a built-in self-test (BIST) circuit or the test circuit can include a BIST circuit for providing the first and second commands and test data associated the first and second commands, providing phase information for the second test clock information, receiving actual data resulting from the propagation of the first command to the first one or more of the memory channels and the propagation of the second command to the second one or more memory channels, comparing the test data with the actual data, and providing an indication of the performance of the memory with respect to the propagation of the first command to the first one or more of the memory channels and the propagation of the second command to the second one or more memory channels.

Figure 2:
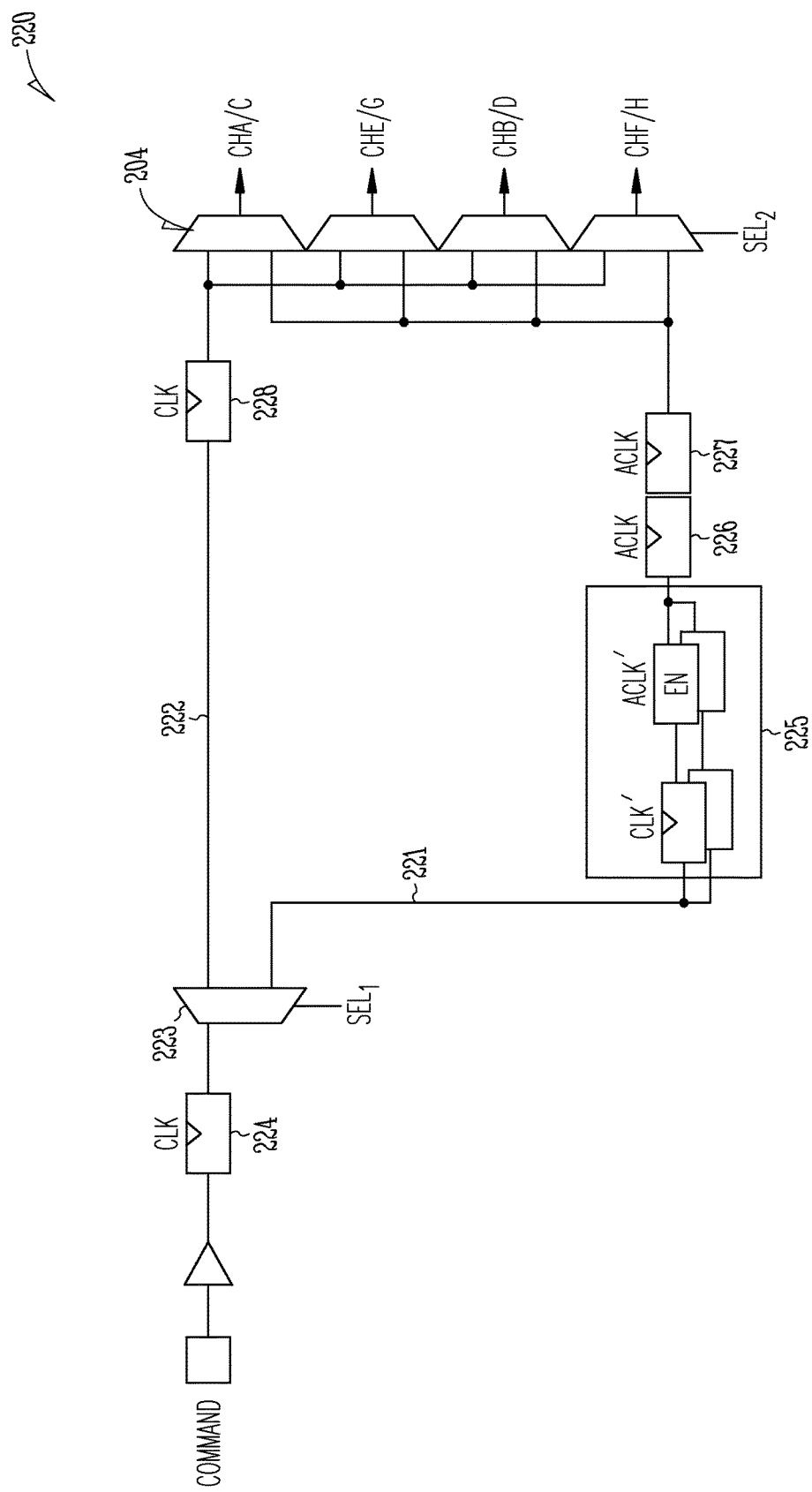
FIG. 2 illustrates example test processing paths of an example interface circuit, according to various embodiments.

FIG. 2 illustrates example selection circuitry 220 of an example interface circuit, according to various embodiments. In certain examples, the selection circuitry 220 can include propagation circuits, or test processing paths 221, 222, that can help identify issues associated with high bandwidth memory failures due to asynchronous noise resulting from independent communications via the multiple channels of a high bandwidth memory system. In certain examples, the test processing paths 221, 222 reside in the test circuit of the memory interface chip. In some examples, the test processing paths 221, 222 can reside in the test circuit or a combination of the test circuit and the channel controller.

The test processing paths 220 can include a first test processing path 221 and a second test processing path 222. In certain examples, an input multiplexer 223 can receive command information and route the command information to either the first test processing path 221 or the second test processing path 222 based on a first selection information ($SEL_1$) from controller of the memory interface chip. In some examples, a delay element 224 may precede the input multiplexer 223 and can be clocked using first clock information (CLK). In certain examples, the first test processing path 221 can include a first-in, first-out (FIFO) circuit 225, and one or more delay circuits 226, 227 driven by second clock information (ACLK). In certain examples, commands routed to the first processing path 221 are stored in the FIFO 225 in response to the first clock information (CLK), such as a transition of the first clock information (CLK), and are subsequently retrieved from the FIFO in response to the second clock information (ACLK). In certain examples, the second test processing path 222 can include one or more delay elements 228 driven by the first clock information (CLK), however, the second test processing path 222 generally can include less total delay than the first processing path 221.

In certain examples, the first test processing path 221 can receive first test command information and can delay propagation of the first test command information to a memory channel selector 204 using the FIFO 225 and the one or more delay circuits 226, 227. In certain examples, the second test processing path 222 can receive second test command information and can propagate the second test command information to the memory channel selector 204 while the first command information is propagating though the first test processing path 221. In general, propagation of test command information along the first and second test processing paths 221, 222 can occur at least partially simultaneously after reception of the second test command information. In this context, at least partially simultaneously includes situations where communication of test commands to the memory via the multiple memory channels (FIG. 1, 107), or communications via the multiple memory channels (FIG. 1, 107) resulting from commands sent to the memory, at least partially overlap in time. In certain examples, the various delays of the first test processing path and the second test processing path can allow the first and second test command information to be routed to various memory channels (ChA, . . . , ChG) simultaneously. In certain examples, the memory channel selector 204 can route the first test information to a first one or more memory channels and can simultaneously route the second test commend information to a second one or more memory channels base on second selection information ($SEL_2$) from a controller of the memory interface chip.

In certain examples, various delay and control elements in the first test processing path 221 can be clocked using the second test clock information (ACLK) while various delay and control elements in the second test processing path 222 can be clocked using the first test clock information (CLK).

In certain examples, phase information associated with the second clock information (ACLK) can be adjusted. Such adjustment can allow the propagation of the first test command information to be precisely controlled with respect to the propagation of the second test command information. Upon propagating the first and second test command information and allowing the memory to execute the commands of the test command information, the status of the memory can be evaluated for successful completion of the commands. For certain test command information and timing, the memory may fail to successfully complete a command due to interference resulting from the simultaneous propagation of command information on each of the various memory channels. In certain examples, the first test command information can be different than the second test command information. For example, the first test command information can include a "read" command and the second test command information can include a "write" command. In certain examples, the first test lock information (CLK) can include a frequency different from the second test clock information (ACLK). In certain examples, a phase of the first test clock information (CLK) can be different than a phase of the second test clock information (ACLK).

In certain examples, the tester can use the first and second test processing paths to test and identify sets of interference inducing test command information and timing. In certain examples, test results from executing several tests using the first and second test processing paths 221, 222 can be aggregated by the tester. In some examples, the tester can display the aggregated test results using a Shmoo plot.

Figure 3:
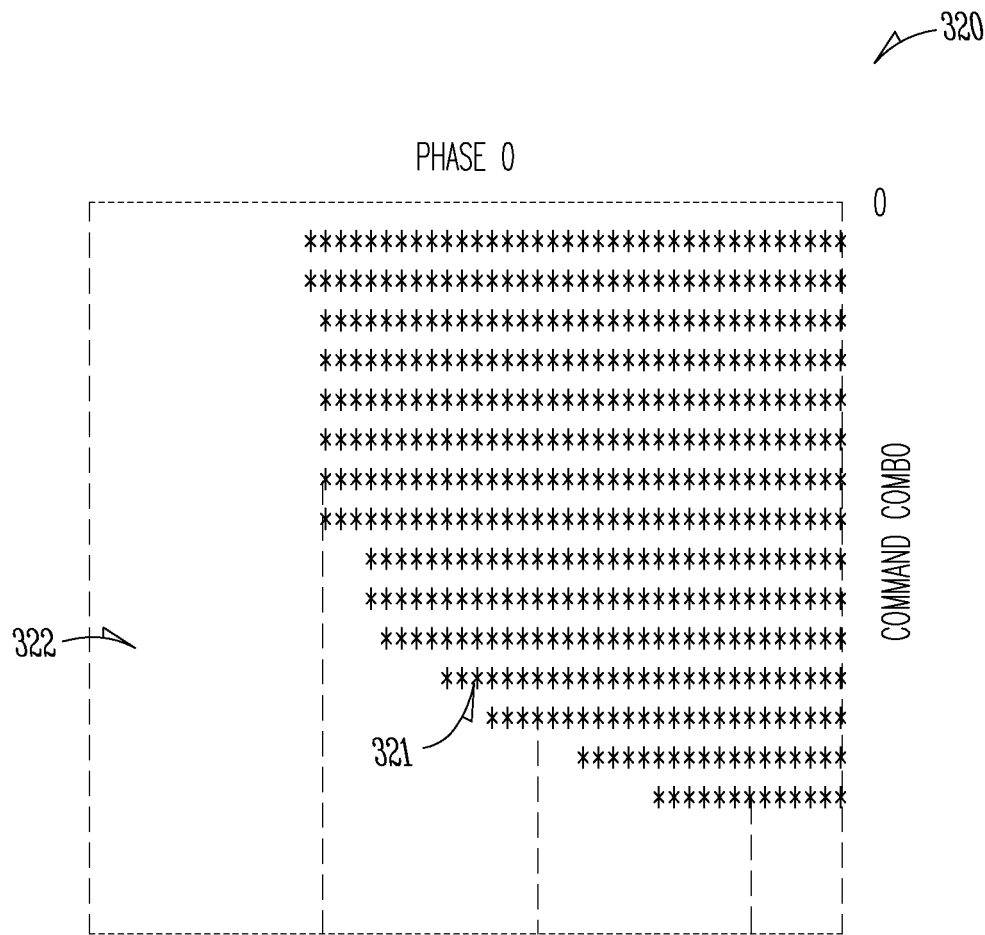
FIG. 3 illustrates an example Shmoo plot for evaluating test information from a multi-channel memory system, according to various embodiments.

FIG. 3 illustrates an example Shmoo plot 320 for evaluating test information from a multi-channel memory system, according to various embodiments. In certain examples, a Shmoo plot can allow identification of command information and timing that has a high probability of failing due to inter-channel noise interference (e.g., the probability of failure is greater than not). For example, in certain examples, the Shmoo plot can graphically assist in identifying areas of successful operation 321 and areas of operational failure 322 of a system such as a high-bandwidth memory system. In certain examples, variable data, such a simultaneous command combinations or command phase timing, can be represented on a Shmoo plot, as Shmoo plot information. In certain examples, the information derived from the Shmoo plot can be used to program a processor to avoid the interference inducing combinations that have been identified by the information, when using the high bandwidth memory that is susceptible to such interference. Furthermore, such diagnostic testing and information gathering can be accomplished without increasing the Test PAD and BUMP number, or increasing the BIST circuit scale.

Figure 4:
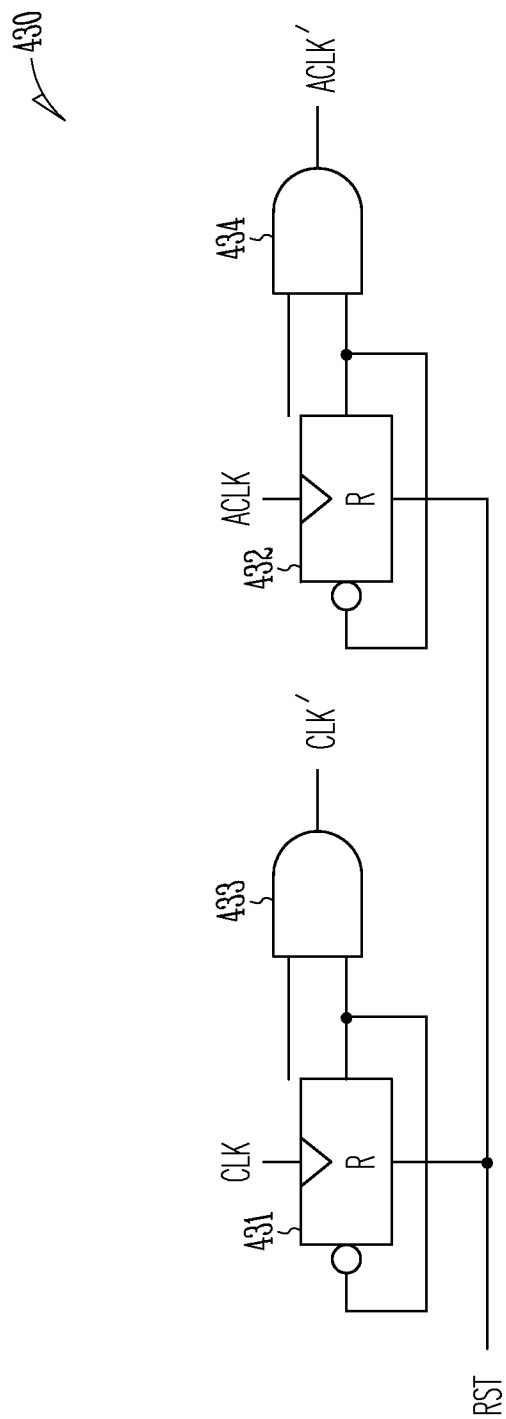
FIG. 4 illustrates an example circuit for generating derivative first and second test clock information, according to various embodiments.

FIG. 4 illustrates an example circuit 430 for generating derivative first and second test clock information (CLK', ACLK'), according to various embodiments. In some examples, the derivative first and second clock information (CLK', ACLK') can be used to operate the FIFO 225 of FIG. 2. The example circuit of FIG. 4 can include a pair of resettable latches 431, 432 and a pair of AND gates 433, 434 that form a divider circuit and can divide a frequency of a received clock signal (CLK, ACLK) by two to generate the derivative test clock information (CLK', ACLK'). In certain examples, first derivative test clock information (CLK') can be generated using clock information (CLK) received from the tester (FIG. 1, 101). In some examples, second derivative test clock information (ACLK') can be generated using second test clock information (ACLK) received from an external source other than the tester. In certain examples, the external source can include the ability to sweep the phase of the second test clock information (ACLK) as well as the second derivative test clock information (ACLK'). In certain examples, the tester can provide the second test clock information (ACLK). In certain examples, a phase-lock loop (PLL) of the memory interface chip or of the test circuit can be used to generate the second test clock information (ACLK). In some examples, phase generation of the second test clock information (ACLK) can be programmable.

Figure 5:
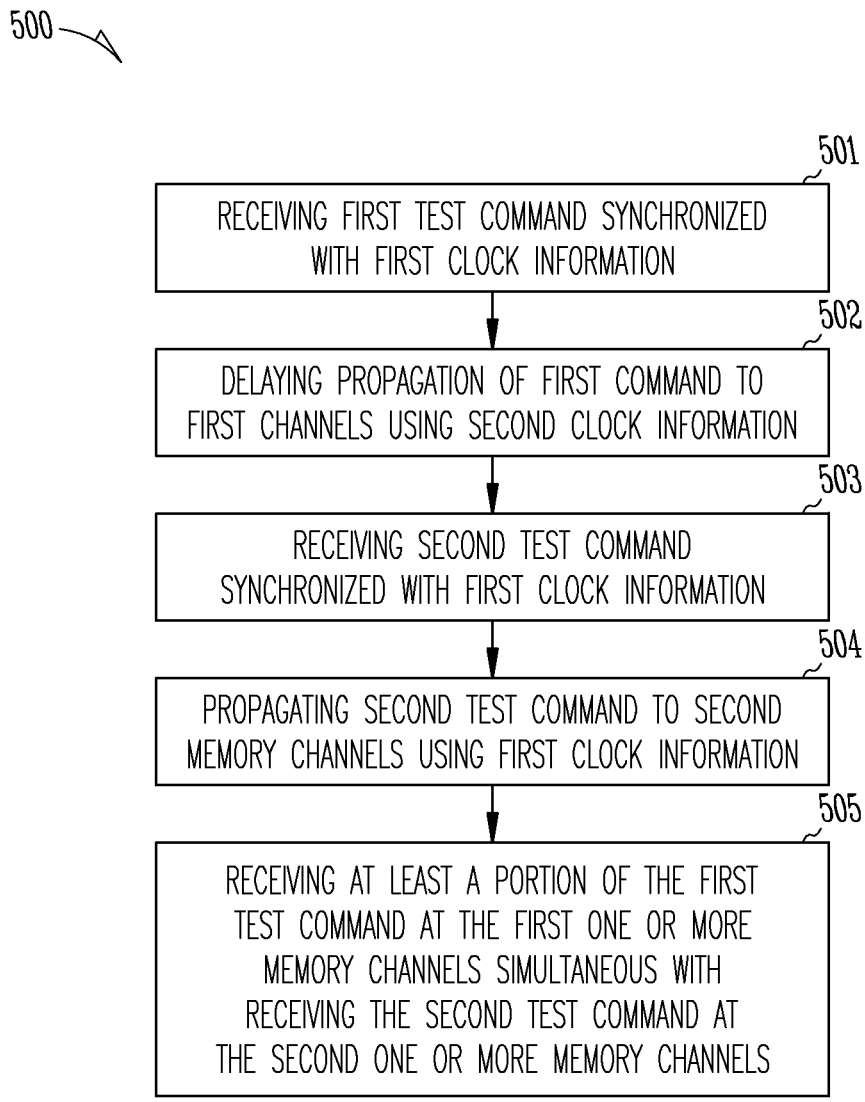
FIG. 5 illustrates an example method of testing a high bandwidth, multi-channel memory system, according to various embodiments.

FIG. 5 illustrates an example method 500 of testing a high bandwidth, multi-channel memory system, according to various embodiments. At 501, a first test command can be received at a test circuit of a memory interface chip coupled to the memory of the memory system. In certain examples, the first command can be received in synchronization with first test clock information and the memory interface chip can be coupled to the memory via a plurality of memory channels. At 502, propagation of the first command to first one or more memory channels of the plurality of memory channels can be delayed using second test clock information. At 503, after reception of the first command and in synchronization with the first test clock, a second command can be received at the test circuit of the memory interface chip. At 504, the second command can be propagated to a second one or more of the memory channels in synchronization with the first test clock information. In certain examples, at 505, the delaying propagation of the first command to the first one or more of the memory channels and the propagating of the second command to the second one or more memory channels can include receiving at least a portion of the first command at the first one or more memory channels that is substantially simultaneous with receiving the second command at the second one or more memory channels. After propagating both commands to the memory via the multi-channel interface and allowing the commands to execute, the resulting data can be compared to expected results to evaluate whether the simultaneous propagation and execution of the two commands interfered with each other. Additional tests can be conducted and evaluated using the method discussed above. In certain examples, some additional tests can use the type of command as a variable. In some additional tests, the phase of the second clock information can be used as a variable. Additional test, of course, can use a combination of variables including a combination of command type and second clock information phasing. Results of such testing can assist in identifying certain combinations of commands and timing that have a high probability of causing interference when routed to the memory via the multiple channels substantially simultaneously. Upon identification, interface circuitry or other solutions can be modified to avoid or significantly reduce the chance of those high probability situations from occurring. Elimination of at least some of the high probability interference command and timing combinations with allow the memory system to operate more consistently at higher speeds than without considering such situations.

Figure 6A:
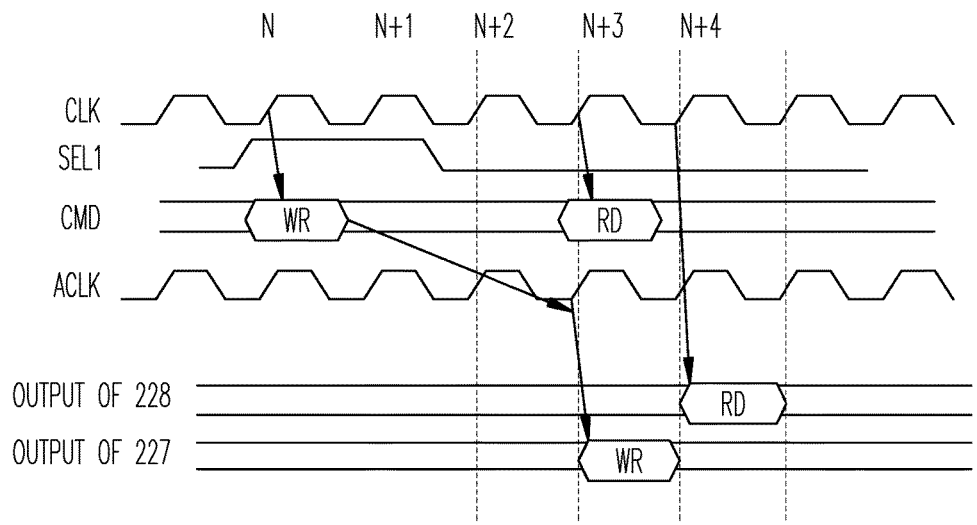
FIGS. 6A and 6B illustrate example waveforms of the example interface circuit of FIG. 2, according to various embodiments.
Figure 6B:
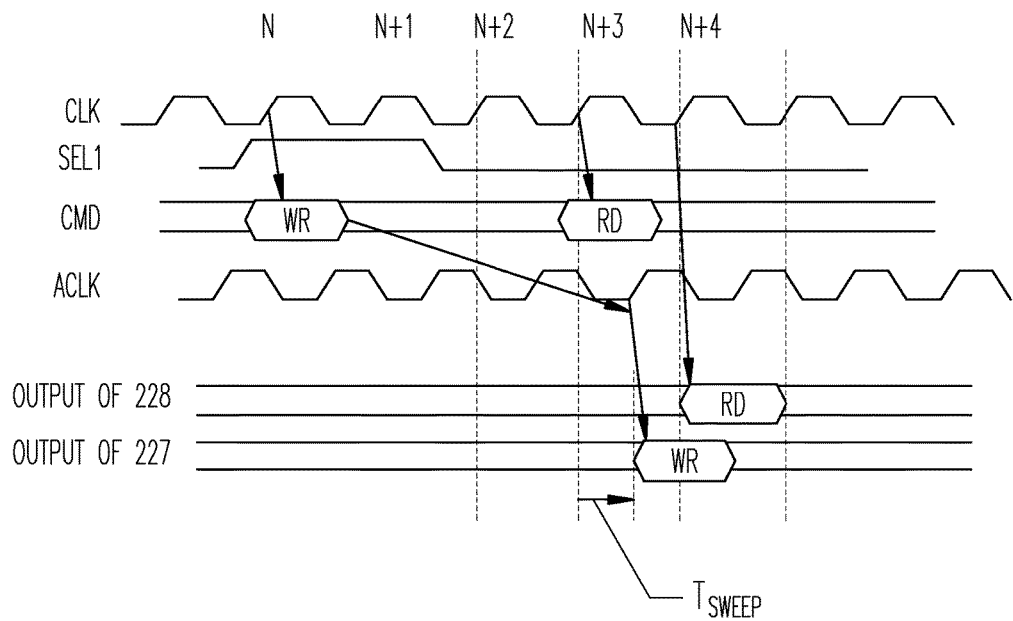

FIGS. 6A and 6B illustrate example waveforms of the example selection circuitry 220 of FIG. 2, according to various embodiments. FIG. 6A illustrates a waveform of the selection circuitry 220 operated by the second test clock information (ACLK) with no shift, and FIG. 6B illustrates a wave form of the selection circuitry 220 operated by the ACLK with a shift (Tsweep).

As shown in the step 501 in FIG. 5, the delay circuit can latch the first test command, for example, a write command (WR) at a timing N. The latched write command (WR) can be transferred to the test processing path 221 by the first selection information (SEL$_1$) having a high logic level. The FIFO circuit 225 can change a timing of the write command (WR) from CLK to ACLK. The delay circuits 226, 227 can delay the write command (WR) output from the FIFO circuit 225 with the two ACLK rising edges. As a result, the delay circuit 227 can output an internal write command (WR) at the timing N+3, as shown in FIG. 6A. The internal write command (WR) can be sent to a channel selected by the second selection information (SEL2). The channel performs a write operation to receive a write data from the tester 101 and write it into at least one selected memory cell in the selected channel in the memory 103 via the interface chip, for example.

As shown in the step 503 in FIG. 5, the delay circuit can latch the second test command, for example, read command (RD) at a timing N+3. The latched read command (RD) can be transferred to the test processing path 222 by the first selection information (SEL$_1$) having a low logic level. The delay circuit can output an internal read command (RD) at a timing N+4. The internal read command (RD) can be sent to a channel selected by the SEL2. The channel can perform a read operation to read a data in at least one selected memory cell in the memory 103 and the read data is sent to the tester 101 via the interface chip 102, for example. The tester 101 can compare the read data and a test data in the tester which was previously written into the memory cell from which the read data was read, for example. The comparison result can plotted by the shmoo plotter. The test operation mentioned in the above can be performed by a BIST circuit including a PLL provided in the interface chip 102

In certain examples, the tester 101 or the test circuit 105 can shift a timing of ACLK, as shown in FIG. 6B and repeat the sequence 501 to 505 of FIG. 5. The sweeping of the timing of ACLK can change the timing the read and write operation, and allows detection of the influence of the noise stemmed from the write operation by checking the accuracy of the read data.

As discussed above, superimposed noise between channels of a multiple channel memory bus can be tested, measured and evaluated without increasing the number of external connection terminals of a memory interface chip or substantially increasing the scale of a BIST.

Examples and Notes

The present subject matter can be described by way of several non-limiting examples. Some of these will now be listed in the following paragraphs.

In Example 1, an apparatus can include a test channel to couple to a memory tester, a memory channel controller to couple with a plurality of memory arrays via a plurality of memory channels, and a test circuit coupled between the test channel and the memory channel controller, the test circuit to provide first and second test clock information to the memory channel controller. In certain examples, the test circuit can receive a first command in synchronization with the first test clock information, can delay propagation of the first command to a first one or more memory channels of the plurality of memory channels using the second test clock information, can receive a second command from the test circuit, after reception of the first command, in synchronization with the first test clock information, and can propagate the second command to a second one or more memory channels of the plurality of memory channels in synchronization with the first test clock information. In certain examples, the propagation of the first command to the first one or more of the memory channels and the propagation of the second command to the second one or more memory channels can at least partially overlap in time.

In Example 2, the first command of Example 1 optionally is different than the second command.

In Example 3, the first test clock information of any one or more of Examples 1-2 optionally includes a frequency different than the second test clock information.

In Example 4, a phase of the first test clock information of any one or more of Examples 1-3 optionally is different than a phase of the second test clock information.

In Example 5, a test of any one or more of Examples 1-4 optionally includes the propagation of the first command and the second command using the first one or more memory channels and the second one or more memory channels. In certain examples, a plurality of tests can optionally include a different phase of the second test clock information for each test of the plurality of tests.

In Example 6, the test circuit of any one or more of Examples 1-5 optionally is to receive the second test clock information at an input.

In Example 7, the test circuit of any one or more of Examples 1-6 optionally includes a phase-lock loop (PLL) to generate the second test clock information.

In Example 8, the apparatus of any one or more of Examples 1-7 optionally includes a divider circuit to receive clock information from the memory tester and to generate the first test clock information and the second test clock information.

In Example 9, the apparatus of any one or more of Examples 1-8 optionally includes a multi-channel bus to couple an electronic device processor with the memory channel controller.

In Example 10, the apparatus of any one or more of Examples 1-9 optionally includes a first-in, first-out circuit (FIFO) to receive the first command on a transition of the first test clock information and to subsequently output the first command on a transition of the second test clock information.

In Example 11, the apparatus of any one or more of Examples 1-10 optionally includes one or more delay circuits to receive the first command from the FIFO, to receive the second test clock information and to delay the propagation of the first command to the memory channel controller using the one or more delay circuits and the second test clock information.

In Example 12, the memory channel controller of any one or more of Examples 1-11 optionally includes a selection circuit to receive a selection command and to select the first one or more memory channels from the plurality of memory channels based on the selection command.

In Example 13, the apparatus of any one or more of Examples 1-12 optionally includes a built-in self-test (BIST) circuit to provide the first and second commands and test data associated the first and second commands.

In Example 14, the indication of any one or more of Examples 1-13 optionally includes Shmoo plot information.

In Example 15, variable data of the Shmoo plot information of any one or more of Examples 1-14 optionally includes one of the first command, the second command, or a phase of the second test clock information.

In Example 16, a method can include receiving, in synchronization with first test clock information, a first test command at a test circuit coupled to memory via a plurality of memory channels, delaying propagation of the first command to a first one or more memory channels of the plurality of memory channels using second test clock information; receiving, after reception of the first command and in synchronization with the first test clock, a second command at the test circuit, and propagating the second command to a second one or more memory channels of the plurality of memory channels in synchronization with the first test clock information, wherein the delaying propagation of the first command to the first one or more memory channels and the propagating of the second command to the second one or more memory channels includes receiving at least a portion of the first command at the first one or more memory channels simultaneous with receiving the second command at the second one or more memory channels.

In Example 17, the first command of any one or more of Examples 1-16 optionally is different than the second command.

In Example 18, the first test clock information of any one or more of Examples 1-17 optionally includes a frequency different than a frequency of the second test clock information.

In Example 19, a phase of the first test clock information of any one or more of Examples 1-18 optionally is different than a phase of the second test clock information.

In Example 20, the conducting a test cycle of any one or more of Examples 1-19 optionally includes propagating the first command and the second command partially simultaneously using the first one or more memory channels and the second one or more memory channels, and the method of any one or more of Examples 1-19 optionally includes conducting a plurality of tests, wherein each test of the plurality of tests includes using a different phase of the second test clock information.

In Example 21, a memory interface chip can include a multiple channel bus to couple to a processor, a multiple channel memory bus to couple to a plurality of memory arrays, a channel controller to couple the multiple channel bus with the multiple channel memory bus, and a test circuit coupled to the channel controller, the test circuit configured to substantially simultaneously propagate first test command information via a first one or more channels of the multiple channel memory bus and second test command information via a second one or more channels of the multiple channel memory bus to identify communication issues during simultaneous use of channels of the multiple channel memory bus.

In Example 22, the memory interface chip of any one or more of Examples 1-21 optionally is to delay propagation of the first command information to the first one or more channels using first test clock information, and, after initiating propagation of the first command information, to propagate the second command to a second one or more memory channels of the plurality of memory channels in synchronization with second test clock information.

In Example 23, the interface chip of any one or more of Examples 1-22 optionally is to receive the first test clock information at a first input.

In Example 24, the memory interface chip of any one or more of Examples 1-23 optionally includes a phase-lock loop to generate the first test clock information.

In Example 25, the interface chip of any one or more of Examples 1-24 optionally is to receive the second test clock information at a second input, the second input to couple to a memory tester.

In Example 26, a memory interface chip can include a test circuit and the test circuit can include a node capable of receiving a plurality of commands, a first selector configured to selectively send the received each of the plurality of commands to a first path or second path responsive to a first selection signal, a first propagation circuit configured to propagate a first command on the first path responsive to a first clock; a second propagation circuit configured to propagate a second command on the second path responsive to a second clock different from the first clock, and a second selector configured to receive the first and second commands output from the first and second propagation circuits, respectively, and selectively output one of the first and second commands responsive to a second selection signal.

In Example 27, the memory interface chip of any one or more of Examples 1-26 optionally includes a test terminal capable of receiving the plurality of commands and coupled to the node, a non-test terminal capable of receiving a plurality of non-test commands, a controller configured to be coupled to the test terminal through the test circuit, and to be coupled to the non-test terminal without intervening the test circuit.

Example 28, can include, or can optionally be combined with any portion or combination of any portions of any one or more of Examples 1 through 27 to include, subject matter that can include means for performing any one or more of the functions of Examples 1 through 27, or a machine-readable medium including instructions that, when performed by a machine, cause the machine to perform any one or more of the functions of Examples 1 through 27.

The above Description of Embodiments includes references to the accompanying drawings, which form a part of the detailed description. The drawings show, by way of illustration, specific embodiments in which methods, apparatuses, and systems discussed herein can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

The flowchart and block diagrams in the figures illustrate the architecture, functionality, and operation of possible implementations of systems, methods and computer program products according to various aspects of the present disclosure. In this regard, each block in the flowchart or block diagrams can represent a module, segment, or portion of code, which comprises one or more executable instructions for implementing the specified logical function(s). It should also be noted that, in some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The functions or processes described herein can be implemented in software, hardware, human implemented procedures, or a combination thereof. The software can consist of computer executable instructions stored on computer readable media such as memory or other type of storage devices. The term "computer readable media" is also used to represent any means by which the computer readable instructions can be received by the computer, such as by different forms of wired or wireless transmissions. Further, such functions correspond to modules, which are software, hardware, firmware or any combination thereof. Multiple functions can be performed in one or more modules as desired, and the embodiments described are merely examples. The software can be executed on a digital signal processor, ASIC, microprocessor, or other type of processor operating on a computer system, such as a personal computer, server or other computer system. In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

As used herein, a "-" (dash) used when referring to a reference number means or, in the non-exclusive sense discussed in the previous paragraph, of all elements within the range indicated by the dash. For example, 103A-B means a nonexclusive or of the elements in the range {103A, 103B}, such that 103A-103B includes "103A but not 103B", "103B but not 103A", and "103A and 103B". The above description is intended to be illustrative, and not restrictive. For example, the above-described examples (or one or more aspects thereof) can be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Description of Embodiments, various features can be grouped together to streamline the disclosure. This should not be interpreted as intending that an unclaimed disclosed feature is essential to any claim. Rather, inventive subject matter can lie in less than all features of a particular disclosed embodiment. Thus, the following claims are hereby incorporated into the Description of Embodiments as examples or embodiments, with each claim standing on its own as a separate embodiment, and it is contemplated that such embodiments can be combined with each other in various combinations or permutations. The scope of the various embodiments of the invention should be determined with reference to the appended claims, along with the full scope of legal equivalents to which such claims are entitled.

What is claimed is:

1. An apparatus comprising:
   a test channel to couple to a memory tester;
   a memory channel controller to couple with a plurality of memory arrays via a plurality of memory channels;
   a test circuit coupled between the test channel and the memory channel controller, the test circuit to provide first and second test clock information to the memory channel controller;
   wherein the test circuit is to receive a first command in synchronization with the first test clock information, to delay propagation of the first command to a first one or more memory channels of the plurality of memory channels using the second test clock information, to receive a second command from the test circuit, after reception of the first command, in synchronization with the first test clock information, and to propagate the second command to a second one or more memory channels of the plurality of memory channels in synchronization with the first test clock information; and
   wherein the propagation of the first command to the first one or more of the memory channels and the propagation of the second command to the second one or more memory channels is to at least partially overlap in time.

2. The apparatus of claim 1, wherein the first command is different than the second command.

3. The apparatus of claim 1, wherein the first test clock information includes a frequency different than the second test clock information.

4. The apparatus of claim 1, wherein a phase of the first test clock information is different than a phase of the second test clock information.

5. The apparatus of claim 1, wherein a test includes the propagation of the first command and the second command using the first one or more memory channels and the second one or more memory channels; and
   wherein a plurality of tests includes a different phase of the second test clock information for each test of the plurality of tests.

6. The apparatus of claim 1, wherein the test circuit is to receive the second test clock information at an input.

7. The apparatus of claim 1, wherein the test circuit includes a phase-lock loop (PLL) to generate the second test clock information.

8. The apparatus of claim 1, including a divider circuit to receive clock information from the memory tester and to generate the first test clock information and the second test clock information.

9. The apparatus of claim 1, including a multi-channel bus to couple an electronic device processor with the memory channel controller.

10. The apparatus of claim 1, including a first-in, first-out circuit (FIFO) to receive the first command on a transition of the first test clock information and to subsequently output the first command on a transition of the second test clock information.

11. The apparatus of claim 10, including one or more delay circuits to receive the first command from the FIFO, to receive the second test clock information and to delay the propagation of the first command to the memory channel controller using the one or more delay circuits and the second test clock information.

12. The apparatus of claim 1, wherein the memory channel controller includes a selection circuit to receive a selection command and to select the first one or more memory channels from the plurality of memory channels based on the selection command.

13. The apparatus of claim 1, including a built-in self-test (BIST) circuit to provide the first and second commands and test data associated the first and second commands.

14. The apparatus of claim 13, wherein the BIST is configured to receive actual data from the plurality of memory channels in response to the first and second commands and the test data, and to provide an indication of performance of the plurality of memory arrays with respect to the propagation of the first commands to the first one or more of the memory channels and the propagation of the second command to the second one or more memory channels; and wherein the indication includes Shmoo plot information.

15. The apparatus of claim 14, wherein variable data of the Shmoo plot information includes one of the first command, the second command, or a phase of the second test clock information.

16. A method comprising:
receiving, in synchronization with first test clock information, a first test command at a test circuit coupled to memory via a plurality of memory channels;
delaying propagation of the first command to a first one or more memory channels of the plurality of memory channels using second test clock information;
receiving, after reception of the first command and in synchronization with the first test clock, a second command at the test circuit; and
propagating the second command to a second one or more memory channels of the plurality of memory channels in synchronization with the first test clock information;
wherein the delaying propagation of the first command to the first one or more memory channels and the propagating of the second command to the second one or more memory channels includes receiving at least a portion of the first command at the first one or more memory channels simultaneous with receiving the second command at the second one or more memory channels.

17. The method of claim 16, wherein the first command is different than the second command.

18. The method of claim 16, wherein the first test clock information includes a frequency different than a frequency of the second test clock information.

19. The method of claim 16, wherein a phase of the first test clock information is different than a phase of the second test clock information.

20. The method of claim 16, wherein conducting a test cycle includes propagating the first command and the second command partially simultaneously using the first one or more memory channels and the second one or more memory channels; and
wherein the method includes conducting a plurality of tests, wherein each test of the plurality of tests includes using a different phase of the second test clock information.

21. A memory interface chip comprising:
a multiple channel bus to couple to a processor;
a multiple channel memory bus to couple to a plurality of memory arrays;
a channel controller to couple the multiple channel bus with the multiple channel memory bus;
a test circuit coupled to the channel controller, the test circuit configured to substantially simultaneously propagate first test command information via a first one or more channels of the multiple channel memory bus and second test command information via a second one or more channels of the multiple channel memory bus to identify communication issues during simultaneous use of channels of the multiple channel memory bus; and wherein the memory interface chip is configured to delay propagation of the first command information to the first one or more channels of the multiple channel memory bus using first test clock information, and, after initiating propagation of the first command information, to propagate the second command to the second one or more channels of the multiple channel memory bus in synchronization with second test clock information.

22. The memory interface chip of claim 21, wherein the interface chip is to receive the first test clock information at a first input.

23. The memory interface chip of claim 21, including a phase-lock loop to generate the first test clock information.

24. The memory interface chip of claim 21, wherein the interface chip is to receive the second test clock information at a second input, the second input to couple to a memory tester.

25. A memory interface chip comprising:
a test circuit comprising:
a node capable of receiving a plurality of commands;
a first selector configured to selectively send the received each of the plurality of commands to a first path or second path responsive to a first selection signal;
a first propagation circuit configured to propagate a first command of the plurality of commands from the first selector on the first path responsive to a first clock;
a second propagation circuit configured to propagate a second command of the plurality of commands from the first selector on the second path responsive to a second clock different from the first clock; and
a second selector configured to receive the first and second commands output from the first and second propagation circuits, respectively, and selectively output one of the first and second commands responsive to a second selection signal.

26. The memory interface chip of claim 25, further comprising:
a test terminal capable of receiving the plurality of commands and coupled to the node;
a non-test terminal capable of receiving a plurality of non-test commands;
a controller configured to be coupled to the test terminal through the test circuit, and to be coupled to the non-test terminal without intervening the test circuit.

* * * * *